United States Patent [19]

DeVries

[11] 4,375,624

[45] Mar. 1, 1983

[54] SURFACE WAVE ACOUSTIC DEVICE WITH COMPENSATION FOR SPURIOUS FREQUENCY RESPONSE MODES

[75] Inventor: Adrian J. DeVries, Kennewick, Wash.

[73] Assignee: Zenith Radio Corporation, Glenview, Ill.

[21] Appl. No.: 276,140

[22] Filed: Jun. 22, 1981

[51] Int. Cl.³ .......................... H03H 9/42; H03H 9/64
[52] U.S. Cl. .................................. 333/194; 333/151; 333/153; 333/195
[58] Field of Search .................. 333/150–155, 333/193–196; 310/313 R, 313 A, 313 B, 313 C, 313 D; 331/107 A; 330/5.5; 29/25.35; 358/905, DIG 1

[56] References Cited

U.S. PATENT DOCUMENTS

| | | | |
|---|---|---|---|
| 3,810,257 | 5/1974 | Jones et al. | 310/313 B |
| 4,004,254 | 1/1977 | DeVries | 333/153 |
| 4,342,011 | 7/1982 | Iwamoto et al. | 333/151 |

OTHER PUBLICATIONS

DeVries, "Spurious Coupling Between Length-Weighted Transducers Acoustically Connected by Means of a Multistrip Coupler", *Electronics Letters,* May 16, 1974, vol. 10, No. 9, pp. 172-173.

*Primary Examiner*—Marvin L. Nussbaum

[57] ABSTRACT

A surface wave acoustic filter is compensated for diffraction and other spurious effects, which distort its frequency response, by adding an auxiliary acoustic channel which is in parallel with the primary acoustic channel, is out of phase therewith, and mimics the frequency response of the primary channel to the diffracted or other spurious wave.

24 Claims, 3 Drawing Figures

SURFACE WAVE ACOUSTIC DEVICE WITH COMPENSATION FOR SPURIOUS FREQUENCY RESPONSE MODES

This invention relates to surface wave acoustic devices, such as filters, which have an improved frequency response characteristic.

BACKGROUND AND PRIOR ART

Surface wave acoustic signal channels are often used as filters, for example in the IF sections of commercial television receivers. A typical configuration employs a sending interdigital transducer and a receiving interdigital transducer upon a substrate of piezoelectric material. The primary propagation direction of the sending transducer and the primary reception direction of the receiving transducer are parallel, but are usually offset from each other to avoid bulk mode coupling. A multi-strip coupler is employed to transfer the acoustic signal wave laterally from the propagation path to the reception path.

The transducers are also coupled, however, by a diffracted surface wave, which does not travel along these primary paths and is not transferred in the normal way by the multi-strip coupler. This diffracted wave travels in various directions, including a direct path extending more or less diagonally across the coupler to the receiving transducer. Such direct coupling is undesirable in a filter or any other frequency-selective device, because the frequency response of the receiving transducer to the diffracted wave is different from its frequency response to the primary wave. Neglecting diffraction effects, the theoretically expected graph of output voltage over signal frequency for the primary transducer system comprises a passband and rejection bands at frequencies both above and below the passband. The effect of the diffracted wave, however, is to increase the response amplitude within the rejection bands. See the article by the present inventor entitled: "Spurious Coupling Between Length-Weighted Transducers Acoustically Connected By Means of a Multistrip Coupler," in Electronics Letters of May 16, 1974, Vol. 10, No. 10, pp. 172–73.

Often at least one of the transducers is apodized (fingerlength-weighted) to enhance its frequency selectivity. Some of the fingers in such a transducer are relatively short. Since diffraction effects are more pronounced when shorter transducer fingers are employed, the problem of diffraction coupling is even more serious in devices employing one or more apodized transducers.

It would be desirable to prevent or compensate for diffraction coupling, and thereby obtain a frequency response closer to that which is theoretically predicted for the primary wave alone. One suggestion in the prior art is to deposit a surface acoustic wave barrier of dampening or reflecting material over the multi-strip coupler. This approach is disclosed in the present inventor's U.S. Pat. No. 4,004,254, as well as in the above-cited technical article.

The effects of diffraction can also be minimized by enlarging the aperture (i.e. breadth) of the surface wave transducers employed, because such enlargement entails longer transducer finger lengths, which are less susceptible to diffraction effects. But this alternative is quite costly in terms of substrate area when surface wave devices are fabricated upon substrates of monocrystalline YZ cut or 128° cut lithium niobate (LiNbO$_3$). When these substrate materials are used for TV filters, therefore, it is customary to keep the maximum aperture size down to a value of 15$\lambda_o$, where $\lambda_o$ is the center wavelength of the filter passband. In filters with a transducer aperture that size, diffraction effects are significant. The total diffraction and other spurious response in such devices has been measured at about 40 dB below the level of the first order response. This is far from negligible.

BRIEF SUMMARY OF THE INVENTION

The approach of the present invention is to compensate for the frequency response distortion caused by diffraction coupling and by other spurious modes as well. Briefly, it employs an auxiliary acoustic signal channel which is designed to mimic the frequency response of the primary channel to the diffracted wave or other spurious signal, and which is out of phase therewith so as to compensate for spurious effects in the primary channel.

The effect of the diffraction signal upon the primary channel is a second order effect. As such, it is difficult to predict exactly, and even more difficult to deal with in the design of the primary channel. The magnitude of the effect can, however, be measured after the primary channel is built and tested. Then the auxiliary channel is designed so that the compensating response is a first order effect, which is quite predictable in the design stage and repeatable in production.

This invention will now be described in detail, in connection with the following drawings:

DETAILED DESCRIPTION OF THE PREFERRED EMBODIMENTS

Figure 1:
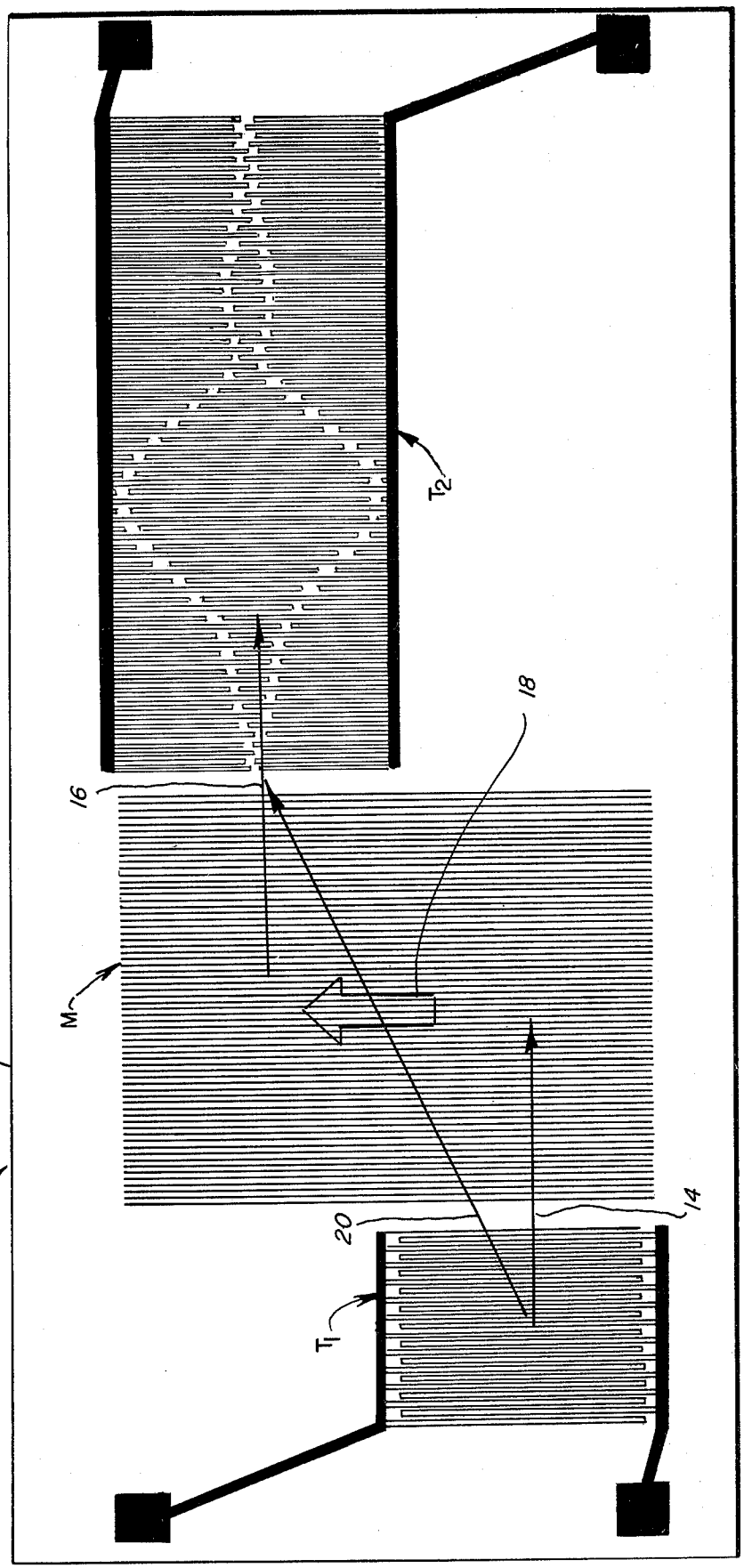
FIG. 1 is a top plan view of a prior art surface wave acoustic filter, which exhibits a non-theoretical frequency response because of diffraction and/or other spurious effects.

The prior art device of FIG. 1 is a surface acoustic wave filter 10 which is particularly adapted for use as a band-pass filter in the intermediate frequency section of a commercial television receiver. It comprises a slab 12 of piezoelectric material 12 on the surface of which are printed, in the form of metallic lines, an interdigital sending transducer T1, a multi-strip coupler M, and a receiving interdigital transducer T2. The receiving transducer is preferably apodized to improve its frequency response characteristics, that is to say the overlapping regions of the transducer fingers are length-weighted along the axis of the transducer T2. The sending transducer T1 could also be apodized, if desired; but often it has uniform fingers in order to conserve substrate area. In another alternate design, the sending transducer T1 could be apodized and the receiving transducer T2 uniform.

The primary acoustic wave propagation direction of the sending transducer T1 is indicated by an arrow 14, while the primary reception direction of the receiving transducer T2 is indicated by an arrow 16. These paths 14 and 16 are parallel to each other, but the two transducers are laterally offset so that the paths do not coincide. This arrangement prevents bulk mode acoustic energy propagated by the sending transducer T1 from influencing the receiving transducer T2. The multi-strip coupler M receives the primary acoustic wave propagated by transducer T1 along path 14, and transfers it laterally, as shown by arrow 18, so that it can be received by transducer T2 along path 16.

Unfortunately, however, the sending transducer T1 also propagates a diffracted acoustic wave in a multi-lobed pattern extending 360° about the transducer T1. One of the directions of propagation is a path 20 which diagonally traverses the multi-strip coupler M and goes directly toward the receiving transducer T2, where it is received by the latter and therefore influences the electric output of the filter 10. This is disadvantageous, because the frequency response of the apodized transducer T2 to the diffracted wave 20 is substantially different from its frequency response to the primary wave propagated along the paths 14 and 16.

The frequency response to the primary wave comprises a passband and rejection bands above and below the passbands in frequency. In TV receiver applications a substantial degree of attenuation is required in the rejection bands in order to minimize the observed interference when spurious signals are present at frequencies adjacent to the desired channel.

Figure 2:
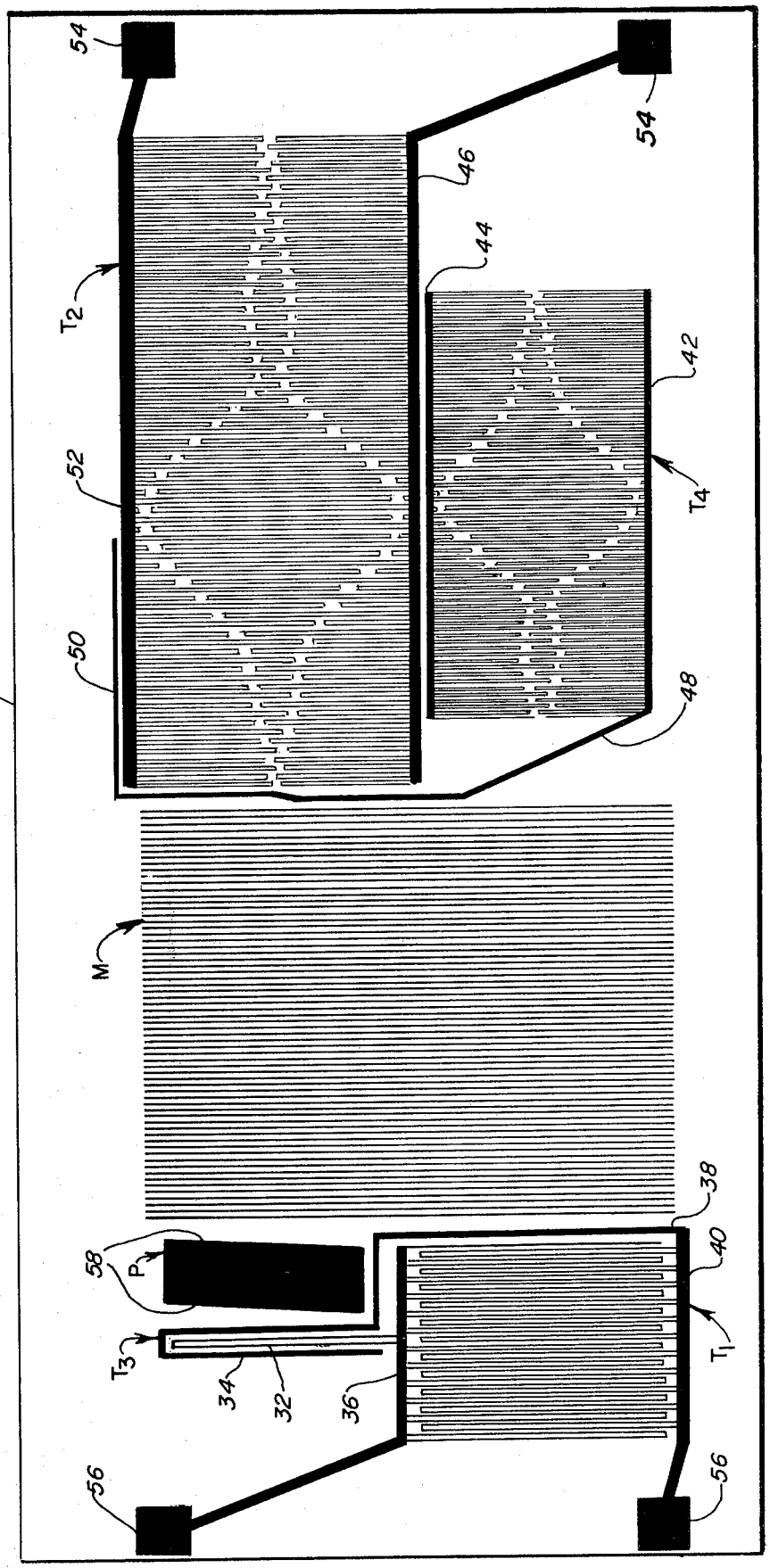
FIG. 2 is a top plan view of a surface acoustic wave filter in accordance with this invention.

FIG. 2 illustrates one embodiment of a filter 30 which is designed to compensate for the effects of the diffracted wave 20 in accordance with the present invention. In this filter the same piezoelectric substrate 12, primary sending transducer T1, multi-strip coupler M, and primary receiving transducer T2 are once again employed. In addition, however, there is an auxiliary sending transducer T3 and an auxiliary receiving transducer T4. In addition, there may be a phase adjusting pad P.

The auxiliary sending transducer T3 comprises a very small number of fingers 32 and 34 of opposite electrical polarity. The auxiliary transducers T3 is connected in parallel electrically with the primary transducer T1, because a split finger 32 is connected directly to one of the bus bars 36 of the primary sending transducer, and the other fingers 34 are connected by a printed circuit lead 38 to the opposite bus bar 40 of transducer T1. As a result, transducer T3 propagates an auxiliary acoustic signal which, like the primary acoustic signal propagated by the transducer T1, is a function of the electrical signal applied to a pair of input terminal pads 56.

The auxiliary receiving transducer T4 comprises a large number of interdigitated fingers, and pairs of these fingers are connected to opposite bus bars 42 and 44. The latter bus bar is in close proximity to one of the bus bars 46 of the primary receiving transducer T2, so that bus bars 44 and 46 are capacitively coupled to each other at frequencies in the range for which operation of the filter 30 is intended. The opposite bus bar 42 of transducer T4 is connected by a printed metal lead 48 to an electrode 50. The latter is in such proximity to the opposite bus bar 52 of the primary receiving transducer that it is also capacitively coupled thereto in the desired frequency range. As a result, the auxiliary receiving transducer T4 is connected electrically in parallel, through a pair of capacitors 44, 46 and 50, 52, so that the electrical outputs of the two receiving transducers T2 and T4 are both taken from output terminal pads 54.

Like the primary transducers T1 and T2, the auxiliary transducers T3 and T4 are laterally offset from each other, and are acoustically coupled through the multi-strip coupler M. Thus, the electrical input signal which arrives at input terminal pads 56 is transmitted through two parallel acoustic channels, and the electrical outputs of both channels are taken from the same output terminals 54. The first, or primary, acoustic channel consists of primary transducer T1, coupler M, and receiving transducer T2. The auxiliary acoustic channel, which is mounted upon the same substrate, piezoelectric slab 12, consists of the sending transducer T3, the same coupler M, and the receiving transducer T4.

The auxiliary acoustic channel, however, is designed to have a different frequency response from the primary acoustic channel. The auxiliary sending transducer T3 has a very broad frequency characteristic because of its small number of interdigitated fingers 32 and 34. This frequency characteristic is broad enough to span the passband plus whatever parts of the rejection bands are significant for the intended application of the filter. The auxiliary receiving transducer T4, however, is apodized to have a more selective frequency response, just as is the primary receiving transducer T2. However the auxiliary transducer system T3, T4 is designed for a first order frequency response characteristic which is substantially similar to the frequency response of the primary system T1, T2 to the diffracted wave 20, or to any other spurious waves which need to be compensated. In view of the broad frequency characteristic of transducer T3 and the selective frequency response of transducer T4, the overall frequency response of the auxiliary acoustic channel T3, T4 is largely determined by the frequency response characteristics of the auxiliary receiving transducer T4.

The auxiliary transducer system T3, T4 must be designed so that it cancels the effect of the diffracted signal (or other spurious modes) upon the T1, T2 transducer system. To accomplish this, it is necessary that the first order response of the T3, T4 transducer system (as measured between the terminals 54) has the same amplitude as that of the diffracted mode of the T1, T2 transducer system measured between the same terminals, but with a 180° phase difference. The procedure for designing the transducer system T3, T4 to meet these requirements is as follows: A prototype is prepared which lacks transducers T3 and T4, and a measurement is made of the actual frequency response $H_a(\omega)$. Then the theoretical response $H_t(\omega)$ is subtracted phasorially from the actual response $H_a(\omega)$ in order to obtain the spurious response $H_s(\omega) = H_a(\omega) - H_t(\omega)$ due to diffraction and other spurious modes. Then the auxiliary transducer system T3, T4 is designed so that its first order response $H(\omega)$ is of the same magnitude but of opposite sign: $H(\omega) = -H_s(\omega)$. The described method compensates a second order spurious effect in transducer system T1, T2 by a first order effect in the transducer system T3, T4.

To keep the design method simple, one should strive to keep secondary effects, caused by the addition of the transducer system T3, T4, to a minimum.

The design of transducer systems to attain a specific amplitude and frequency response (as a first approximation) is well known in the surface wave acoustic device art. This known procedure is iterated until the desired response $H(\omega)$ is approached as closely as desired. In carrying out the design, typically one first arbitrarily chooses an appropriate design for the uniform sending transducer T3, and then calculates the required design for the apodized receiving transducer T4.

If any difficulty is encountered in achieving exactly the desired phase relationship in the design stage or in production, a phase trimming device in the form of a metalized pad P is introduced into one of the acoustic channels. In the specific example of FIG. 2, it is interposed in the acoustic propagation path of auxiliary sending transducer T3, between T3 and coupler M. The breadth of the pad P along the direction of acoustic propagation (i.e., parallel to arrow 14) determines the amount of phase shift which is introduced into the auxiliary acoustic channel. By adjusting this dimension, either in production or in the design stage, one can trim the phase relationship between the primary and auxiliary acoustic channels.

The side edges 58 of the pad P are angled slightly out of parallel with the fingers of the transducer T3 and coupler M, in order that unwanted reflections from these edges are bounced off at an angle and do not introduce unwanted signals.

Figure 3:
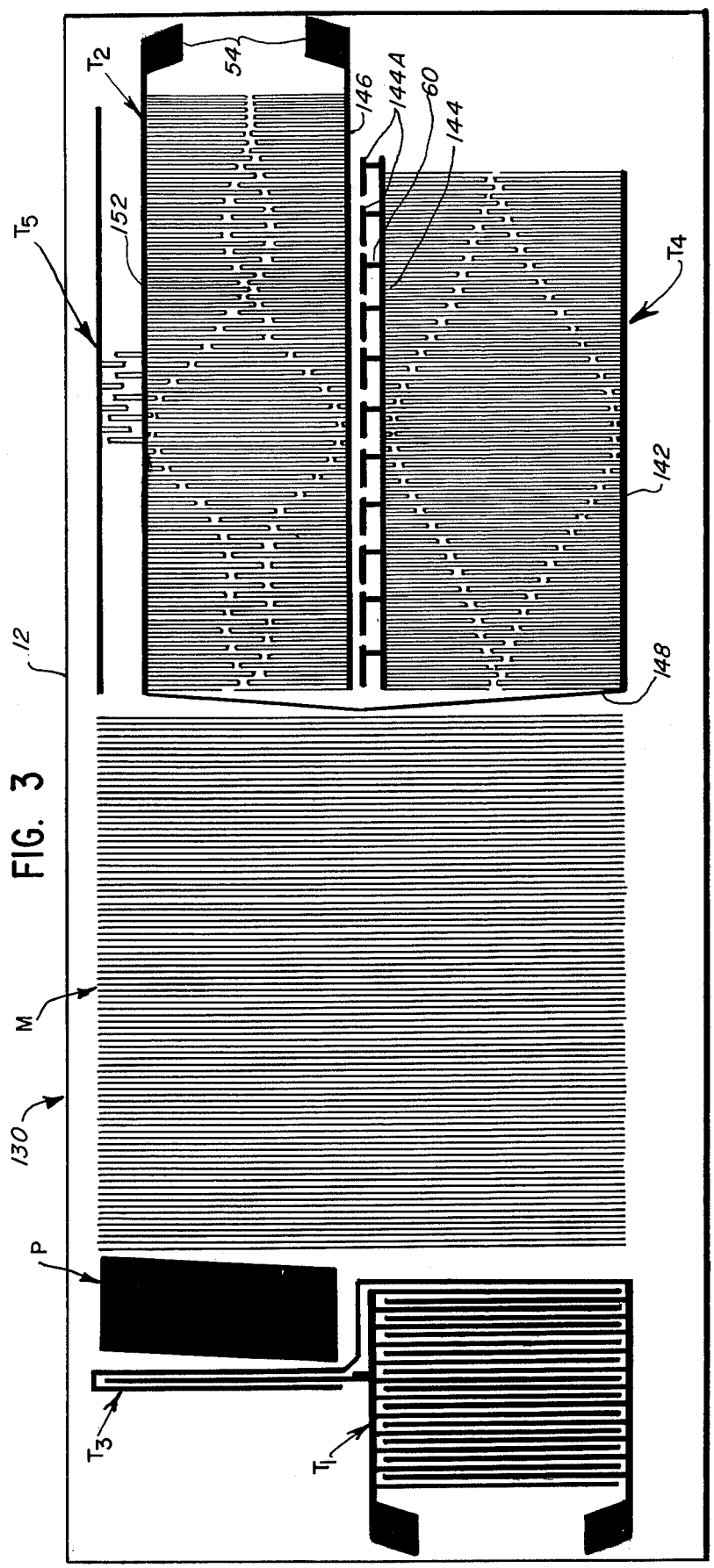
FIG. 3 is a top plan view of an alternative embodiment of a surface acoustic wave filter in accordance with this invention.

The alternative embodiment of the invention illustrated in FIG. 3 is similar in most respects, but differs primarily with respect to the electrical coupling of the two receiving transducers T2 and T4. The electrical coupling between those two transducers in FIG. 2 is balanced, in that both bus bars 42 and 44 of the auxiliary receiving transducer T4 are capacitively coupled to the corresponding bus bars 46 and 52 of the primary receiving transducer T2. In the embodiment of FIG. 3, however, that is not the case.

The acoustic filter 130 in FIG. 3 includes a printed circuit lead 148 which directly connects one of the bus bars 142 of auxiliary receiving transducer T4 to one of the bus bars 152 of primary receiving transducer T2. On the other side, however, the opposing bus bars 144 of the auxiliary receiving transducer and 146 of the primary receiving transducer are once again capacitively coupled to each other; hence the receiving transducers T2 and T4 are once again electrically in parallel with each other, but this time in an unbalanced configuration.

The capacitive coupling in this instance is accomplished through a plurality of individual capacitor electrodes 144A arrayed in capacitive coupled relationship to bus bar 146, and connected directly to bus bar 144 by individual printed circuit leads 60. The advantage of using a plurality of individual capacitor electrodes is that the degree of capacitive coupling can be trimmed in production or in the design stage by eliminating one or more individual electrodes 144A until the desired capacitance is achieved.

In addition, a dummy receiving transducer T5 is included in the filter embodiment 130 to ameliorate triple transit reflection problems. Transducer T5 is a "dummy" in the sense that it is not connected electrically to the output terminal pads 54. Such dummy transducers are described in the prior art.

In this alternative embodiment 130 the auxiliary transducers T3 and T4 again provide an auxiliary parallel acoustic channel which is designed to compensate for the response of the primary receiving transducer T2 to the diffracted wave 20 or any other spurious signals. Transducer T3 has a small number of interdigitated fingers and thus a very broad band frequency characteristic, while transducer T4 has a large number of fingers and is apodized to have a selective frequency response such that the overall response of transducer system T3, T4 mimics the frequency response of transducer system T1, T2 to the diffracted wave. The phase relationships, tuned by pad P, are such that the response of transducer system T3, T4 (as measured at terminals 54) is 180° out of phase with the response due to diffraction and other spurious modes of system T1, T2.

Some additional general design considerations should be mentioned, which are applicable to any embodiment of the invention. As noted above, it has been determined that the magnitude of the spurious response is about 40 dB below the peak of the response to the primary acoustic wave 14, 16. Therefore the first order response of auxiliary transducer system T3, T4 must also be about 40 dB down, compared to the first order response of the primary transducers, in order to keep the compensating effect equal in magnitude to the spurious response.

The total decrement of 40 dB is preferably shared equally (i.e. 20 dB each) between the auxiliary sending transducer T3 and the auxiliary receiving transducer T4. The reason for sharing this decrement equally between T3 and T4 relates to the need for minimizing secondary (i.e. spurious) effects, caused by the addition of the transducer system T3, T4. One of these spurious effects is that auxiliary transducer T3 is slightly coupled to primary transducer T2 through bulk modes. The same holds for the coupling between transducers T1 and T4. Another spurious effect results from the fact that the multi-strip coupler M does not transfer the entire signal from one path to the other. If transducer T3 had the same strength as T1 and transducer T4 had an effective strength of −40 dB, the spurious coupling between transducers T3 and T2 would be quite strong. A similar argument can be made for the coupling between transducers T1 and T4 if T4 were as strong as T2. The best solution is therefore to share the decrement between T3 and T4. Thus, sending transducer T3 is designed so that the effective transmitted acoustic wave amplitude is about 20 dB below that of T1, while the same relation is obtained between T4 and T2.

One way to accomplish the first objective is for the number of finger pairs in T3 to be 1/10 of the number of finger pairs in T1. Since 20 times log 10 equals 20 dB, this 10:1 finger pair ratio accomplishes the desired 20 dB decrement.

The same approach cannot be used with T4 and T2, however, because T4 has been apodized for the purpose of meeting frequency response requirements. Also, it is desired that both T3 and T4 utilize the full available aperture, i.e. half the width of the multi-strip coupler M, in order to avoid any increase in diffraction effects. Accordingly, the capacitive coupling techniques which were described above in connection with FIGS. 2 and 3 are employed to guarantee that the electrical signal output of transducer T4 is approximately 1/10 of the magnitude of the electrical signal output of transducer T2. Since a typical value for the capacitance of transducer T2 is 10 pF, the desired results are achieved if the value of the coupling capacitors 44, 46 and 50, 52 in FIG. 2 are about 2 pF each. In the embodiment of FIG. 3, the total capacitance of all the parallel connected capacitors 144A, 146 is 1 pF.

The illustrated and described embodiments represent the preferred forms of the invention, but alternative embodiments may be imagined which would come within the novel teachings herein. In one such alternate configuration, for example, the strength of transducer T3 may also be reduced by capacitive coupling, in which case the number of figures may have to be increased. Inductive coupling may also be used in place of capacitive coupling, especially at higher frequencies. Furthermore, the effective signal output of a transducer can also be reduced by diminishing the aperture of the transducer. Accordingly, the embodiments discussed herein are to be considered as merely illustrative, and not as limiting the scope of the following claims.

The invention claimed is:

1. In a surface acoustic wave device of the type having a primary surface acoustic signal channel in which information is carried both by a primary wave and a spurious wave, the frequency response of said primary channel to said primary wave being substantially different from its frequency response to said spurious wave; the improvement comprising:

an auxiliary surface acoustic signal channel which is in parallel with said primary channel and which is adapted to have a frequency response substantially similar to that of said primary channel to said spurious wave, and arranged to produce an output substantially out of phase therewith whereby to compensate said primary channel for said spurious wave response.

2. A surface acoustic wave device of the type having electrical input terminal means, primary acoustic wave sending means defining a primary wave propagation path, means coupling said primary sending means to said input terminal means, electrical output terminal means, primary acoustic wave receiving means defining a primary wave reception path offset from said propagation path, means coupling said primary receiving means to said output terminal means, and acoustic wave coupling means for offsetting a wave from said propagation path to said reception path, said primary receiving means being arranged to develop an electrical output across said output terminal means in response to said offset wave, said primary sending and receiving means being undesirably coupled to each other by a spurious wave propagated toward said primary receiving means by said primary sending means along a path other than said primary propagation path, the frequency response of said primary receiving means to said spurious wave being different from its frequency response to said offset wave; wherein the improvement comprises:

auxiliary wave sending means coupled to said input terminal means and adapted to propagate an auxiliary wave;

auxiliary wave receiving means coupled to said output terminal means and arranged to receive said auxiliary wave;

said auxiliary receiving means being arranged to have a frequency response to said auxiliary wave which is similar to the frequency response of said primary receiving means to said spurious wave, and to develop an electrical output signal across said output terminal means in response to said auxiliary wave which is substantially opposite in phase to the output signal developed thereacross in response to said spurious wave by said primary receiving means, whereby to compensate at least partially for the effect of said spurious wave upon said primary receiving means.

3. A device as in claim 2 further comprising a piezoelectric substrate, said primary sending and receiving means and said auxiliary sending and receiving means all being commonly supported upon said substrate.

4. A device as in claim 3 wherein said auxiliary sending and receiving means are offset from each other and coupled by the same said acoustic wave coupling means as are said primary sending and receiving means.

5. A device as in claim 3 wherein said primary and auxiliary sending and receiving means comprise respective interdigital transducers each of which is of the type having a plurality of fingers arranged in two electrically oppositely connected groups and the fingers of each such group are so spaced from each other as to be in phase with respect to a given acoustic wave impinging upon the transducer; the fingers of said auxiliary sending and receiving means being so designed and positioned with respect to those of said primary sending and receiving means that the electrical output developed across said output terminal means by said auxiliary receiving means in response to said auxiliary wave is substantially out of phase with the electrical output developed across said output terminal means by said primary receiving means in response to said diffracted wave.

6. A device as in claim 2 wherein said primary sending and receiving means and said auxiliary sending and receiving means are so arranged that the output developed across said output terminal means by said auxiliary receiving means in response to said auxiliary wave is of substantially lower amplitude than the output developed across said output terminal means by said primary receiving means in response to said offset wave.

7. A device as in claim 6 wherein the differential between said amplitudes is about 40 dB.

8. A device as in claim 6 wherein said primary and auxiliary sending means comprise respective interdigital transducers each of which is of the type having a plurality of electrically oppositely connected pairs of fingers, and the number of finger pairs in said primary sending means is several times greater than the number of finger pairs in said auxiliary sending means.

9. A device as in claim 8 wherein the ratio between the number of finger pairs in said primary and auxiliary sending means is about 10.

10. A device as in claim 6 wherein said means for coupling said auxiliary receiving means to said output terminal means comprises capacitor means coupling said primary and auxiliary receiving means in parallel across said output terminal means, the capacitance of said capacitor means being several times smaller than the internal capacitance of said primary receiving means whereby there is a tendency for the output voltage developed across the capacitive impedance of said primary receiving means to be several times as great as the output voltage developed across said capacitor means by said auxiliary receiving means.

11. A device as in claim 10 wherein the ratio between the capacitances of said primary receiving means and said coupling capacitor means is about 10.

12. A device as in claim 11 wherein said primary and auxiliary sending means comprise respective interdigital transducers each of which is of the type having a plurality of electrically oppositely connected pairs of fingers, and the number of finger pairs in said primary sending means is about 10 times greater than the number of finger pairs in said auxiliary sending means.

13. A surface acoustic wave device of the type having a substrate of piezoelectric material, a primary acoustic wave sending interdigital transducer on a surface of said substrate defining an orthogonal acoustic wave propagation path, a primary acoustic wave receiving interdigital transducer on said substrate surface defining an orthogonal acoustic wave reception path offset from said propagation path, and multi-strip acoustic wave coupling means for offsetting a wave from said propagation path to said reception path, said primary sending and receiving transducers being undesirably coupled to each other by a diffracted signal propagated toward said primary receiving transducer by said primary sending transducer along a path at a substantial angle to said orthogonal paths, the frequency response of said primary receiving transducer to said diffracted wave being different from its frequency response to said offset wave; wherein the improvement comprises:

an auxiliary acoustic wave sending interdigital transducer on said substrate surface;

an auxiliary acoustic wave receiving interdigital transducer on said substrate surface, acoustically coupled to said auxiliary sending transducer;

at least one of said auxiliary transducers being apodized in such manner that the frequency response of said auxiliary transducers is similar to the frequency response of said primary receiving transducer to said diffracted wave;

means on said substrate surface electrically coupling said primary and auxiliary sending transducers so that the acoustic wave output of said auxiliary sending transducer is related to said diffracted wave;

the interdigitated finger pairs of said auxiliary sending and receiving transducers being so positioned relative to those of said primary sending and receiving transducers that the electrical output of said auxiliary receiving transducer developed in response to said auxiliary sending transducer is substantially out of phase with the electrical output of said primary receiving transducer developed in response to said diffracted wave;

and means on said substrate surface electrically coupling said primary and auxiliary receiving transducers whereby said out-of-phase output at least partially cancels said diffracted wave output.

14. A device as in claim 13 further comprising means in the acoustic coupling path between said auxiliary transducers for modifying the phase of the wave from said auxiliary sending transducer reaching said auxiliary receiving transducer.

15. A device as in claim 14 wherein said phase-modifying means comprises a metalized area on said substrate surface.

16. A device as in claim 13 wherein:

said auxiliary sending transducer is acoustically coupled to said multi-strip coupling means;

and said auxiliary receiving transducer is acoustically coupled to said multi-strip coupling means to receive therefrom the wave propagated by said auxiliary sending transducer.

17. A device as in claim 13 or 16 wherein said one of said auxiliary transducers is positioned alongside one of said primary transducers.

18. A device as in claim 17 wherein said auxiliary receiving and sending transducers are positioned alongside said primary receiving and sending transducers respectively, and said means for electrically coupling at least one pair of juxtaposed transducers comprise common bus bar means on said substrate surface electrically connected to one side of each of said juxtaposed transducers for directly electrically connecting said sides of said juxtaposed transducers together.

19. A device as in claim 18 further comprising metal lead means on said substrate surface directly electrically connecting the opposite sides of said juxtaposed transducers.

20. A device as in claim 17 wherein said means for electrically coupling at least one pair of juxtaposed transducers comprises:

first bus bar means on said substrate surface at one side of one of said juxtaposed transducers;

and second bus bar means on said substrate surface at one side of the other of said juxtaposed transducers capacitively coupled to said first bus bar means whereby to electrically couple said sides of said receiving transducers.

21. A device as in claim 20 further comprising metal lead means on said substrate surface electrically connected to the other side of one of said juxtaposed transducers and capacitively coupled to the other side of the other of said juxtaposed transducers.

22. A devide as in claim 20 further comprising metal lead means on said substrate surface electrically connected to the other sides of both said juxtaposed transducers.

23. A device as in claim 20 wherein said bus bars are sufficiently close to each other to achieve said capacitive coupling.

24. A device as in claim 20 further comprising a plurality of individual metal capacitor electrodes on said surface of said substrate each electrically connected to one of said bus bars and sufficiently close to the other of said bus bars to achieve said capacitive coupling, whereby said capacitive coupling is a function of the number of said capacitor electrodes.

* * * * *